(12) United States Patent
Wehrly, Jr.

(10) Patent No.: US 7,511,969 B2
(45) Date of Patent: Mar. 31, 2009

(54) COMPOSITE CORE CIRCUIT MODULE SYSTEM AND METHOD

(75) Inventor: James Douglas Wehrly, Jr., Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 237 days.

(21) Appl. No.: 11/345,910

(22) Filed: Feb. 2, 2006

(65) Prior Publication Data

US 2007/0176286 A1 Aug. 2, 2007

(51) Int. Cl.
*H05K 1/11* (2006.01)
(52) U.S. Cl. .................................. 361/803; 361/760
(58) Field of Classification Search ................. 361/749, 361/760, 783–785, 789, 803; 174/254
See application file for complete search history.

(56) References Cited

U.S. PATENT DOCUMENTS

| | | |
|---|---|---|
| 3,372,310 A | 3/1968 | Kantor |
| 3,436,604 A | 4/1969 | Hyltin |
| 3,582,865 A | 6/1971 | Franck et al. |
| 3,654,394 A | 4/1972 | Gordon |
| 3,704,455 A | 11/1972 | Scarbrough |
| 3,718,842 A | 2/1973 | Abbott, III et al. |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |

(Continued)

FOREIGN PATENT DOCUMENTS

EP 122-687 A 10/1984

(Continued)

OTHER PUBLICATIONS

PCT/US05/28547 International Search Report and Written Opinion, PCT, Aug. 18, 2006.

(Continued)

*Primary Examiner*—Dean A. Reichard
*Assistant Examiner*—Yuriy Semenenko
(74) *Attorney, Agent, or Firm*—Fish & Richardson P.C.

(57) ABSTRACT

A circuit module is provided in which at least one secondary substrate and preferably two such secondary substrates are populated with integrated circuits (ICs). A rigid core substrate for the circuit module is comprised of a structural member and a connective member. In a preferred embodiment, the structural member is comprised of thermally conductive material while the connective member is comprised of conventional PWB material. The secondary substrate(s) are connected to the connective member with a variety of techniques and materials while, in a preferred embodiment, the connective member exhibits, in a preferred embodiment, traditional module contacts which provide an edge connector capability to allow the module to supplant traditional DIMMs.

19 Claims, 10 Drawing Sheets

U.S. PATENT DOCUMENTS

| | | |
|---|---|---|
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, 3rd et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewicz et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,688,606 A | 11/1997 | Mahulikar et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bollesen |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |
| 6,025,992 A | 2/2000 | Dodge et al. |
| 6,028,352 A | 2/2000 | Eide |
| 6,028,365 A | 2/2000 | Akram et al. |
| 6,034,878 A | 3/2000 | Osaka et al. |
| 6,038,132 A | 3/2000 | Tokunaga et al. |
| 6,040,624 A | 3/2000 | Chambers et al. |
| 6,049,975 A | 4/2000 | Clayton |
| 6,060,339 A | 5/2000 | Akram et al. |
| 6,072,233 A | 6/2000 | Corisis et al. |
| 6,078,515 A | 6/2000 | Nielsen et al. |
| 6,084,294 A | 7/2000 | Tomita |
| 6,091,145 A | 7/2000 | Clayton |
| 6,097,087 A | 8/2000 | Farnworth et al. |
| 6,111,757 A | 8/2000 | Dell et al. |
| 6,121,676 A | 9/2000 | Solberg |
| RE36,916 E | 10/2000 | Moshayedi |
| 6,157,541 A | 12/2000 | Hacke |
| 6,172,874 B1 | 1/2001 | Bartilson |

| | | |
|---|---|---|
| 6,178,093 B1 | 1/2001 | Bhatt et al. |
| 6,180,881 B1 | 1/2001 | Isaak |
| 6,187,652 B1 | 2/2001 | Chou et al. |
| 6,205,654 B1 | 3/2001 | Burns |
| 6,208,521 B1 | 3/2001 | Nakatsuka |
| 6,208,546 B1 | 3/2001 | Ikeda |
| 6,214,641 B1 | 4/2001 | Akram |
| 6,215,181 B1 | 4/2001 | Akram et al. |
| 6,215,687 B1 | 4/2001 | Sugano et al. |
| 6,222,737 B1 | 4/2001 | Ross |
| 6,222,739 B1 | 4/2001 | Bhakta et al. |
| 6,225,688 B1 | 5/2001 | Kim et al. |
| 6,232,659 B1 | 5/2001 | Clayton |
| 6,233,650 B1 | 5/2001 | Johnson et al. |
| 6,234,820 B1 | 5/2001 | Perino et al. |
| 6,262,476 B1 | 7/2001 | Vidal |
| 6,262,895 B1 | 7/2001 | Forthun |
| 6,265,660 B1 | 7/2001 | Tandy |
| 6,266,252 B1 | 7/2001 | Karabatsos |
| 6,281,577 B1 | 8/2001 | Oppermann et al. |
| 6,288,907 B1 | 9/2001 | Burns |
| 6,288,924 B1 | 9/2001 | Sugano et al. |
| 6,300,679 B1 | 10/2001 | Mukerji et al. |
| 6,316,825 B1 | 11/2001 | Park et al. |
| 6,323,060 B1 | 11/2001 | Isaak |
| 6,336,262 B1 | 1/2002 | Dalal et al. |
| 6,343,020 B1 | 1/2002 | Lin et al. |
| 6,347,394 B1 | 2/2002 | Ochoa et al. |
| 6,349,050 B1 | 2/2002 | Woo et al. |
| 6,351,029 B1 | 2/2002 | Isaak |
| 6,357,023 B1 | 3/2002 | Co et al. |
| 6,358,772 B2 | 3/2002 | Miyoshi |
| 6,360,433 B1 | 3/2002 | Ross |
| 6,368,896 B2 | 4/2002 | Farnworth et al. |
| 6,370,668 B1 | 4/2002 | Garrett, Jr. et al. |
| 6,376,769 B1 | 4/2002 | Chung |
| 6,392,162 B1 | 5/2002 | Karabatsos |
| 6,404,043 B1 | 6/2002 | Isaak |
| 6,410,857 B1 | 6/2002 | Gonya |
| 6,418,034 B1 * | 7/2002 | Weber et al. ................. 361/790 |
| 6,426,240 B2 | 7/2002 | Isaak |
| 6,426,549 B1 | 7/2002 | Isaak |
| 6,426,560 B1 | 7/2002 | Kawamura et al. |
| 6,428,360 B2 | 8/2002 | Hassanzadeh et al. |
| 6,433,418 B1 | 8/2002 | Fujisawa et al. |
| 6,444,921 B1 | 9/2002 | Wang et al. |
| 6,446,158 B1 | 9/2002 | Karabatsos |
| 6,449,159 B1 | 9/2002 | Haba |
| 6,452,826 B1 | 9/2002 | Kim et al. |
| 6,459,152 B1 | 10/2002 | Tomita et al. |
| 6,462,412 B2 | 10/2002 | Kamei et al. |
| 6,465,877 B1 | 10/2002 | Farnworth et al. |
| 6,465,893 B1 | 10/2002 | Khandros et al. |
| 6,472,735 B2 | 10/2002 | Isaak |
| 6,473,308 B2 | 10/2002 | Forthun |
| 6,486,544 B1 | 11/2002 | Hashimoto |
| 6,489,687 B1 | 12/2002 | Hashimoto |
| 6,502,161 B1 | 12/2002 | Perego et al. |
| 6,514,793 B2 | 2/2003 | Isaak |
| 6,521,984 B2 | 2/2003 | Matsuura |
| 6,528,870 B2 | 3/2003 | Fukatsu et al. |
| 6,531,772 B2 | 3/2003 | Akram et al. |
| 6,544,815 B2 | 4/2003 | Isaak |
| 6,552,910 B1 | 4/2003 | Moon et al. |
| 6,552,948 B2 | 4/2003 | Woo et al. |
| 6,560,117 B2 | 5/2003 | Moon |
| 6,566,746 B2 | 5/2003 | Isaak et al. |
| 6,572,387 B2 | 6/2003 | Burns et al. |
| 6,573,593 B1 | 6/2003 | Syri et al. |
| 6,576,992 B1 | 6/2003 | Cady et al. |
| 6,588,095 B2 | 7/2003 | Pan |
| 6,590,282 B1 | 7/2003 | Wang et al. |
| 6,600,222 B1 | 7/2003 | Levardo |
| 6,614,664 B2 | 9/2003 | Lee |
| 6,627,984 B2 | 9/2003 | Bruce et al. |
| 6,629,855 B1 | 10/2003 | North et al. |
| 6,646,936 B2 | 11/2003 | Hamamatsu et al. |
| 6,660,561 B2 | 12/2003 | Forthun |
| 6,661,092 B2 | 12/2003 | Shibata et al. |
| 6,677,670 B2 | 1/2004 | Kondo |
| 6,683,377 B1 | 1/2004 | Shim et al. |
| 6,690,584 B2 | 2/2004 | Uzuka et al. |
| 6,699,730 B2 | 3/2004 | Kim et al. |
| 6,720,652 B2 | 4/2004 | Akram et al. |
| 6,721,181 B1 | 4/2004 | Pfeifer et al. |
| 6,721,185 B2 | 4/2004 | Dong et al. |
| 6,721,226 B2 | 4/2004 | Woo et al. |
| 6,744,656 B2 | 6/2004 | Sugano et al. |
| 6,751,113 B2 | 6/2004 | Bhakta et al. |
| 6,756,661 B2 | 6/2004 | Tsuneda et al. |
| 6,760,220 B2 | 7/2004 | Canter et al. |
| 6,762,942 B1 | 7/2004 | Smith |
| 6,768,660 B2 | 7/2004 | Kong et al. |
| 6,833,981 B2 | 12/2004 | Suwabe et al. |
| 6,833,984 B1 | 12/2004 | Belgacem |
| 6,839,266 B1 | 1/2005 | Garrett, Jr. et al. |
| 6,841,868 B2 | 1/2005 | Akram et al. |
| 6,850,414 B2 | 2/2005 | Benisek et al. |
| 6,873,534 B2 | 3/2005 | Bhakta et al. |
| 6,878,571 B2 | 4/2005 | Isaak et al. |
| 6,884,653 B2 | 4/2005 | Larson |
| 6,914,324 B2 | 7/2005 | Rapport et al. |
| 6,919,626 B2 | 7/2005 | Burns |
| 6,956,284 B2 | 10/2005 | Cady et al. |
| 7,053,478 B2 | 5/2006 | Roper et al. |
| 7,094,632 B2 | 8/2006 | Cady et al. |
| 7,180,167 B2 | 2/2007 | Partridge et al. |
| 7,233,501 B1 * | 6/2007 | Ingalz ........................ 361/760 |
| 7,393,226 B2 | 7/2008 | Clayton et al. |
| 7,394,149 B2 | 7/2008 | Clayton et al. |
| 2001/0001085 A1 | 5/2001 | Hassanzadeh et al. |
| 2001/0006252 A1 | 7/2001 | Kim et al. |
| 2001/0013423 A1 | 8/2001 | Dalal et al. |
| 2001/0015487 A1 | 8/2001 | Forthun |
| 2001/0026009 A1 | 10/2001 | Tsuneda et al. |
| 2001/0028588 A1 | 10/2001 | Yamada et al. |
| 2001/0035572 A1 | 11/2001 | Isaak |
| 2001/0040793 A1 | 11/2001 | Inaba |
| 2001/0052637 A1 | 12/2001 | Akram et al. |
| 2002/0001216 A1 | 1/2002 | SUGANO et al. |
| 2002/0006032 A1 | 1/2002 | Karabatsos |
| 2002/0030995 A1 | 3/2002 | Shoji |
| 2002/0048157 A1 * | 4/2002 | Lee ............................ 361/784 |
| 2002/0076919 A1 | 6/2002 | Peters et al. |
| 2002/0094603 A1 | 7/2002 | Isaak |
| 2002/0101261 A1 | 8/2002 | Karabatsos |
| 2002/0139577 A1 | 10/2002 | Miller |
| 2002/0164838 A1 | 11/2002 | Moon et al. |
| 2002/0180022 A1 | 12/2002 | Emoto |
| 2002/0185731 A1 | 12/2002 | Akram et al. |
| 2002/0196612 A1 * | 12/2002 | Gall et al. .................... 361/760 |
| 2003/0002262 A1 | 1/2003 | Benisek et al. |
| 2003/0026155 A1 | 2/2003 | Yamagata |
| 2003/0035328 A1 | 2/2003 | Hamamatsu et al. |
| 2003/0045025 A1 | 3/2003 | Coyle et al. |
| 2003/0049886 A1 | 3/2003 | Salmon |
| 2003/0064548 A1 | 4/2003 | Isaak |
| 2003/0081387 A1 | 5/2003 | Schulz |
| 2003/0081392 A1 | 5/2003 | Cady et al. |
| 2003/0089978 A1 | 5/2003 | Miyamoto et al. |
| 2003/0090879 A1 | 5/2003 | Doblar et al. |
| 2003/0096497 A1 | 5/2003 | Moore et al. |
| 2003/0109078 A1 | 6/2003 | Takahashi et al. |
| 2003/0116835 A1 | 6/2003 | Miyamoto et al. |
| 2003/0159278 A1 | 8/2003 | Peddle |
| 2003/0168725 A1 | 9/2003 | Warner et al. |

| | | | |
|---|---|---|---|
| 2004/0000708 | A1 | 1/2004 | Rapport et al. |
| 2004/0004822 | A1* | 1/2004 | Ruckerbauer et al. ........ 361/785 |
| 2004/0012991 | A1 | 1/2004 | Kozaru |
| 2004/0021211 | A1 | 2/2004 | Damberg |
| 2004/0066636 | A1* | 4/2004 | Kollipara et al. ............ 361/760 |
| 2004/0150107 | A1 | 8/2004 | Cha et al. |
| 2004/0229402 | A1 | 11/2004 | Cady et al. |
| 2004/0236877 | A1 | 11/2004 | Burton |
| 2004/0238209 | A1* | 12/2004 | Yuri et al. ................... 174/257 |
| 2005/0082663 | A1 | 4/2005 | Wakiyama et al. |
| 2005/0108468 | A1 | 5/2005 | Hazelzet et al. |
| 2005/0133897 | A1 | 6/2005 | Baek et al. |
| 2005/0242423 | A1 | 11/2005 | Partridge et al. |
| 2005/0263911 | A1 | 12/2005 | Igarashi et al. |
| 2006/0020740 | A1 | 1/2006 | Bartley et al. |
| 2006/0050496 | A1 | 3/2006 | Goodwin |
| 2006/0050497 | A1 | 3/2006 | Goodwin |
| 2006/0053345 | A1 | 3/2006 | Goodwin |
| 2006/0091529 | A1 | 5/2006 | Wehrly et al. |
| 2006/0095592 | A1 | 5/2006 | Borkenhagen |
| 2006/0111866 | A1 | 5/2006 | LeClerg et al. |
| 2006/0125067 | A1 | 6/2006 | Wehrly et al. |
| 2007/0211426 | A1 | 9/2007 | Clayton et al. |
| 2007/0211711 | A1 | 9/2007 | Clayton |
| 2007/0212906 | A1 | 9/2007 | Clayton et al. |
| 2007/0212920 | A1 | 9/2007 | Clayton et al. |
| 2008/0192428 | A1 | 8/2008 | Clayton et al. |

FOREIGN PATENT DOCUMENTS

| | | |
|---|---|---|
| EP | 0 298 211 A3 | 1/1989 |
| EP | 1 119049 A2 | 7/2001 |
| GB | 2 130 025 A | 5/1984 |
| JP | 53-85159 | 7/1978 |
| JP | 58-96756 A | 6/1983 |
| JP | 3-102862 | 4/1991 |
| JP | 5-29534 A | 2/1993 |
| JP | 5-335695 A | 12/1993 |
| JP | 2821315 B2 | 11/1998 |
| JP | 2001/077294 A | 3/2001 |
| JP | 2001/085592 A | 3/2001 |
| JP | 2001/332683 A | 11/2001 |
| JP | 2002/009231 A | 1/2002 |
| JP | 2003/037246 A | 2/2003 |
| JP | 2003/086760 A | 3/2003 |
| JP | 2003/086761 A | 3/2003 |
| JP | 2003/309246 A | 10/2003 |
| JP | 2003/347503 A | 12/2003 |
| WO | WO03/037053 | 5/2003 |
| WO | WO 2004/109802 A1 | 12/2004 |

OTHER PUBLICATIONS

PCT/US05/28547 Notification Concerning Transmittal of International Preliminary Report on Patentability, Mar. 15, 2007.
GB 0516622.8 Search Report, May 25, 2006.
PCT/US06/04690 International Search Report, PCT, Feb. 16, 2007.
PCT/US06/04690 International Search Report, PCT, Jul. 20, 2007.
PCT/US06/38720 International Search Report and Written Opinion, PCT, Apr. 5, 2007.
PCT/US06/06921 International Search Report and Written Opinion, PCT, Jun. 1, 2007.
PCT/US06/007193, International Search Report and Written Opinion, PCT, Nov. 7, 2007.
Pages 19-22 of Presentation by Netlist, Aug. 2004.
Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.
Flexible Thinking: Examining the Flexible Circuit Tapes. (Website 2 pages) Fjelstad, Joseph., Published Apr. 20, 2000 on Internet.
Ron Bauer, Intel. "Stacked-CSP Delivers Flexibility, Reliability, and Space-Saving Capabilities", vol. 3, Spring 2002. Published on the Internet.
Tessera Technologies, Inc.—Semiconductor Intellectual Property, Chip Scale Packaging—Website pages (3), Internet.
Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.
William R. Newberry, Design Techniques for Ball Grid Arrays, Xynetic Design Systems, Inc., Portland, Maine, Published on the Internet.
Chip Scale Packaging and Redistribution, Paul A. Magill, Glenn A. Rinne, J. Daniel Mis, Wayne C. Machon, Joseph W. Baggs, Unitive Electronics Inc.
Dense-Pac Microsystems, 16 Megabit High Speed CMOS SRAM DPSIMX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512K X 16 CMOS SRAM Module.
IBM Preliminary 168 Pin SDRAM Registered DIMM Functional Description & Timing Diagrams.
3D Interconnection for Ultra-Dense Multichip Modules, Christian Val, Thomson-CSF DCS Computer Division, Thierry Lemoine, Thomson-CSF RCM Radar Countermeasures Division.
High Density Memory Packaging Technology High-Speed Imaging Applications, Dean Frew, Texas Instruments Incorporated.
Vertically-Integrated Package, Alvin Weinberg, Pacesetter, Inc. and W. Kinzy Jones, Florida International University.
Complaint filed Mar. 8, 2007, in the United States District Court for the District of Massachusetts, Boston Division, Civil Action No. 07 CA 10468 DPW.
Letter dated Sep. 11, 2006, from Chris Karabatsos of Kentron Technologies to John Kelly, President of JEDEC Solid State Technology Association, concerning potential interferences involving U.S. Appl. No. 11/306,803.

* cited by examiner

COMPOSITE CORE CIRCUIT MODULE SYSTEM AND METHOD

FIELD

The present invention relates to systems and methods for creating high density circuit modules.

BACKGROUND

The well-known DIMM (Dual In-line Memory Module) board has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing interface edge of the DIMM into an edge connector socket. Systems that employ DIMMs provide limited space for such devices and conventional DIMM-based solutions have typically provided only a moderate amount of memory expansion.

As die sizes increase, the limited surface area available on conventional DIMMs limits the number of devices that may be carried on a memory expansion module devised according to conventional DIMM techniques. Further, as bus speeds have increased, fewer devices per channel can be reliably addressed with a DIMM-based solution. For example, 288 ICs or devices per channel may be addressed using the SDRAM-100 bus protocol with an unbuffered DIMM. Using the DDR-200 bus protocol, approximately 144 devices may be addressed per channel. With the DDR2-400 bus protocol, only 72 devices per channel may be addressed. This constraint has led to the development of the fully-buffered DIMM (FB-DIMM) with buffered C/A and data in which 288 devices per channel may be addressed. With the FB-DIMM, not only has capacity increased, pin count has declined to approximately 69 signal pins from the approximately 240 pins previously required.

This improvement has, however, come with some cost. The basic principle of systems that employ FB-DIMM relies upon a point-to-point or serial addressing scheme rather than the parallel multi-drop interface that dictates non-buffered DIMM addressing. That is, one DIMM is in point-to-point relationship with the memory controller and each DIMM is in point-to-point relationship with adjacent DIMMs. Consequently, as bus speeds increase, the number of DIMMs on a bus will decline as the discontinuities caused by the chain of point-to-point connections from the controller to the "last" DIMM become magnified in effect as speeds increase.

A variety of techniques and systems for enhancing the capacity of DIMMs and similar modules are known. For example, multiple die may be packaged in a single IC package. A DIMM module may then be populated with such multi-die devices. However, multi-die fabrication and testing is complicated and few memory and other circuit designs are available in multi-die packages.

Other techniques have populated FR4 circuit boards with stacks comprised of packaged integrated circuits. Others techniques have employed daughter cards to increase module capacities. Typically, however, as more circuitry is aggregated on a circuit module, thermal issues become more prominent.

Thermally efficient solutions have been offered by Staktek Group L.P., the assignee of the present invention. For example, Staktek has devised a number of circuit module designs that dispose IC-populated flexible circuitry about a thermally-conductive core to provide a thin and thermally efficient circuit module that may supplant traditional DIMMs such as, for example, registered DIMMs as well as FB-DIMMs to name a few modules that may employ such technologies.

Alternatives to traditional FR4 cored circuit modules have found profitable employment in applications where thermal performance is a significant consideration. Consequently, new designs that provide the advantages of thermal performance with readily understood and inexpensive materials are welcome in the field.

SUMMARY

A circuit module is provided in which at least one secondary substrate and preferably two such secondary substrates are populated with integrated circuits (ICs). A rigid core substrate for the circuit module is comprised of a structural member and a connective member. In a preferred embodiment, the structural member is comprised of thermally conductive material while the connective member is comprised of conventional PWB material. The secondary substrate(s) are connected to the connective member with a variety of techniques and materials while, in a preferred embodiment, the connective member exhibits, in a preferred embodiment, traditional module contacts which provide an edge connector capability to allow the module to supplant traditional DIMMs.

DETAILED DESCRIPTION OF PREFERRED EMBODIMENTS

Figure 1:
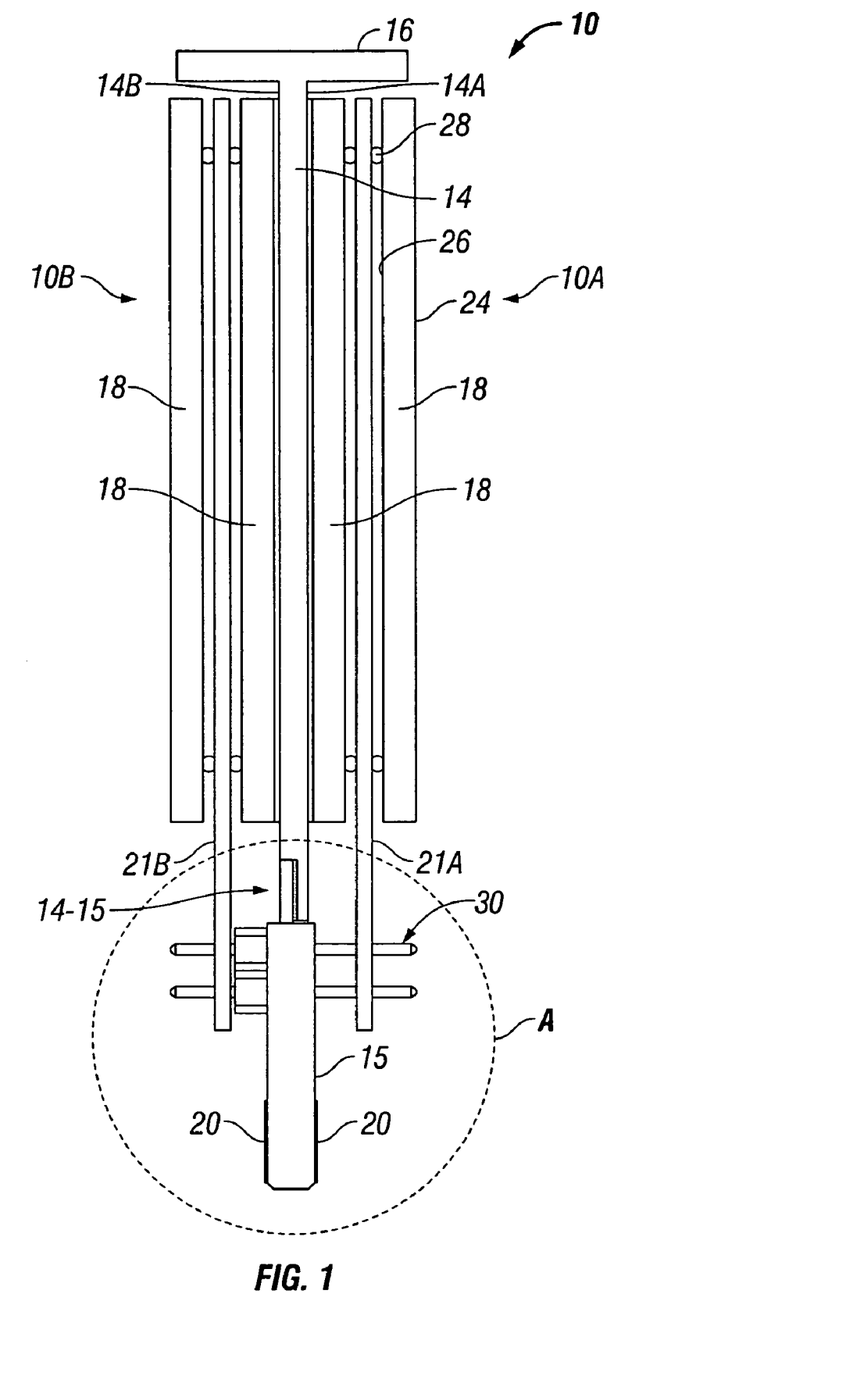
FIG. 1 is a depiction of a module devised in accordance with a preferred embodiment of the present invention.

FIG. 1 depicts module 10 devised in accordance with a preferred embodiment of the present invention. On each of sides 10A and 10B of module 10 are disposed secondary substrates, 21A and 21B, respectively, each of which is populated with ICs 18 that are, in the depicted embodiment, chip-scale packaged ("CSP") memory devices. For purposes of this disclosure, the term chip-scale or "CSP" shall refer to integrated circuitry of any function with an array package providing connection to one or more die through contacts (often embodied as "bumps" or "balls" for example such as the depicted IC contacts 28) distributed along a major surface of the package or die. CSP does not refer to leaded devices that provide connection to an integrated circuit within the package through leads emergent from at least one side of the periphery of the package such as, for example, a TSOP.

Embodiments of the present invention may be employed with leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar Figs.

Multiple integrated circuit die may be included in a package depicted as a single IC 18. In the depicted embodiment, memory ICs are represented to provide a memory expansion board or module. Various other embodiments may, however, employ a variety of integrated circuits and other components. Such variety may include microprocessors, FPGA's, RF transceiver circuitry, and digital logic, as a list of non-limiting examples, or other circuits or systems which may benefit from enhanced high-density circuit board or module capability. Thus, the depicted multiple instances of IC 18 may be devices of a first primary function or type such as, for example, memory, while other devices may be devices of a second primary function or type such as, for example, signal buffers, one example of which is the Advanced Memory Buffer ("AMB") in the fully-buffered circuitry design for modules.

A rigid core composite substrate that will be identified as 14-15 provides structure for module 10 and will be said to be "composite," meaning that it is comprised of a structural member 14 and connective member 15 and thus will be identified as rigid core substrate 14-15 or substrate 14-15. Structural member 14 of substrate 14-15 has lateral sides 14A and 14B along which are respectively disposed, secondary substrates 21A and 21B. Those of skill will recognize that module 10 may be devised to exhibit only one secondary substrate. Structural member 14 is preferably thermally conductive with a metallic material such as aluminum, for example, being preferred, but other materials are suitable as well. For example, certain carbon based materials can be devised as structural member 14 and certain plastics are known to provide thermal conductivity while providing fabrication advantages over carbon materials. Aluminum and other metallic materials are, however, typically cost effective and readily malleable materials from which structural member 14 may be preferentially comprised. Optional extension 16 of structural member 14 is shown as part of structural member 14 and encourages extraction of thermal energy from module 10. Extension 16 may also be appended to structural member 14.

Conductive member 15 is, preferably, PWB comprised of FR4 fabricated with plural layers to provide appropriate connections to module contacts 20 and conductive assembly 30 and thus, to secondary substrates 21A and 21B and their resident ICs. A variety of types of PWB or epoxy or fiber based materials and boards may be employed to implement conductive member 15 which is devised under principles that are well known to those in the industry. The use of familiar and traditional materials for connective member 14 provides advantages of economy and design familiarity that allow beneficial features of traditional DIMM manufacturing to be employed in a new setting that provides thermal and capacity advantages.

Figure 2:
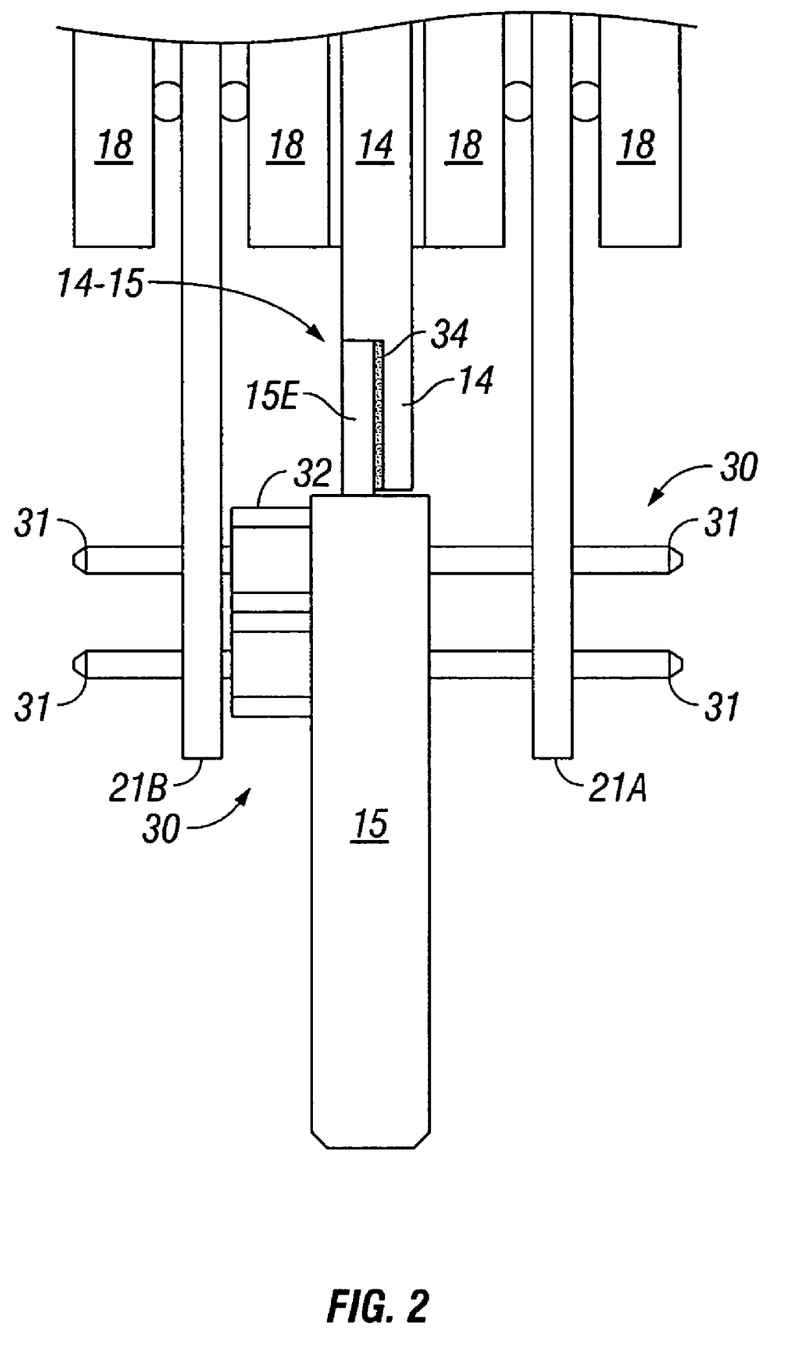
FIG. 2 is an enlarged depiction of the area designated by an "A" in FIG. 1.
Figure 10:
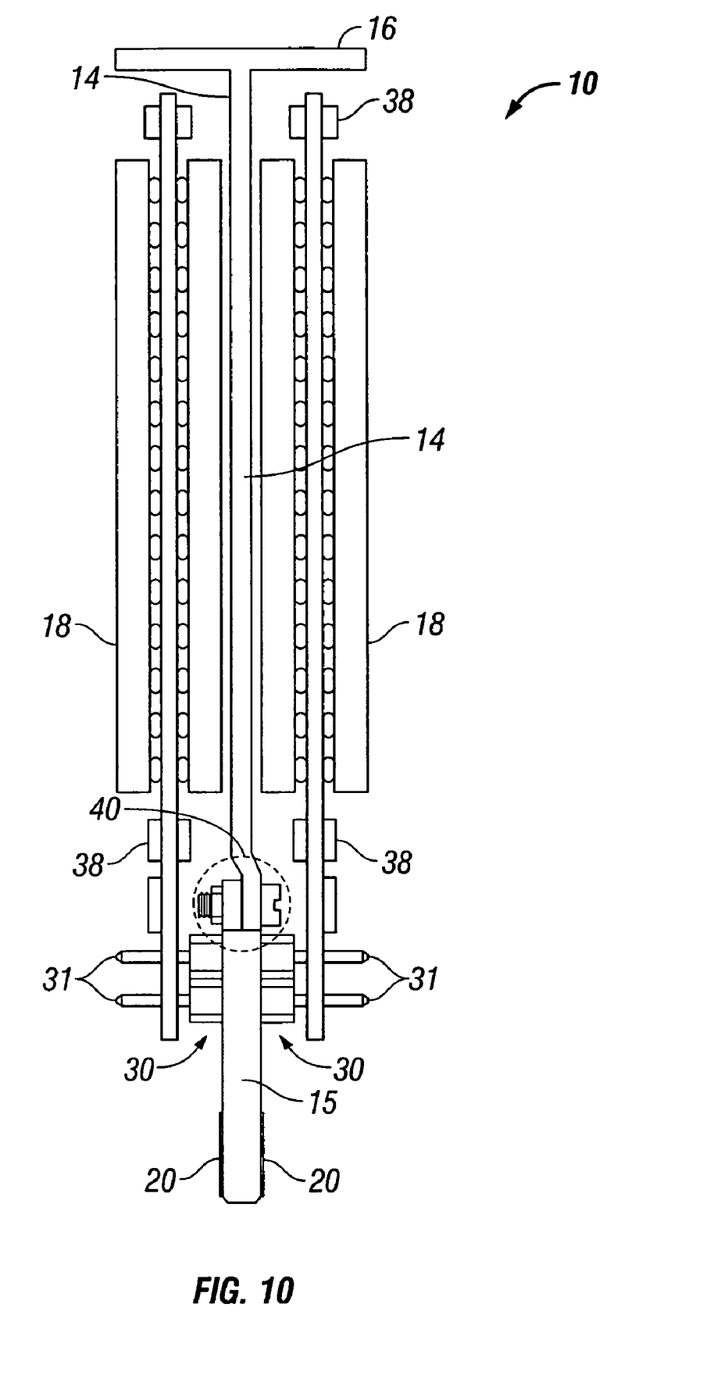
FIG. 10 is a cross-sectional depiction of a circuit module devised in accordance with an alternative embodiment of the present invention.

FIG. 2 is an enlarged depiction of the area identified with an "A" in FIG. 1. As shown in FIG. 2, connective member 15 and structural member 14 are joined together with adhesive 34 between parts 15E of connective member 15 and 14E, of structural member 14 to form composite substrate 14-15. Other techniques may be employed to connect structural member 14 and connective member 15 to form composite substrate 14-15. For example, later FIG. 10 illustrates a bolt assembly to connect structural member 14 and connective member 15.

Conductive assembly 30 is, in the depicted embodiment, comprised of plural pins 31 held together by matrix 32 which, in practice, pass through connective member 15 to provide a connection path between secondary substrates 21A and 21B, respectively, and module contacts 20 (e.g., edge connector contacts) of connective member 15. Conductive assembly 30 implements a connection path therefore, between ICs 18 and edge connector contacts 20 of module 10.

Figure 3:
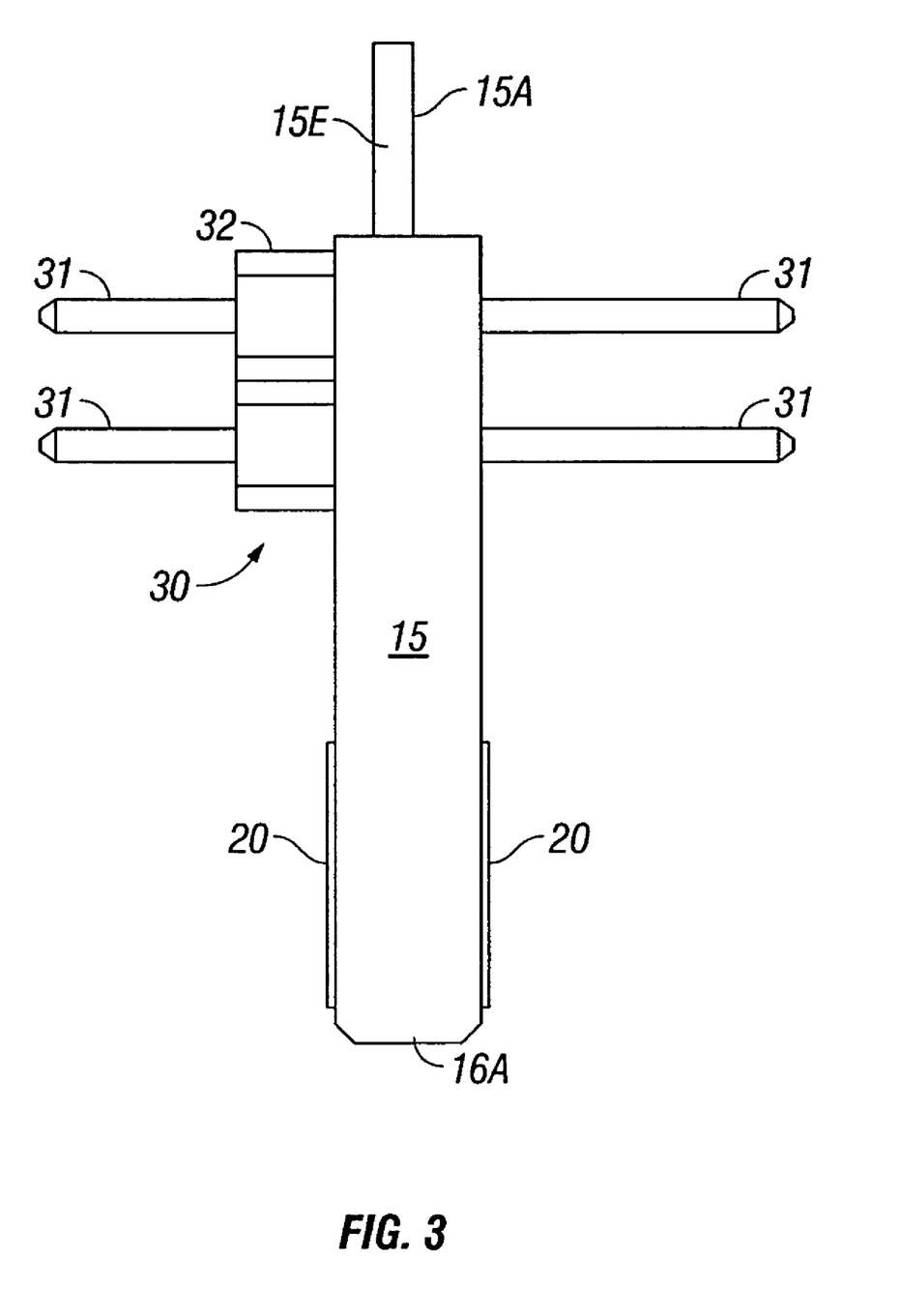
FIG. 3 is an enlarged depiction of a connective member of a substrate prepared for attachment of secondary substrates.

FIG. 3 depicts connective member 15 of composite substrate 14-15 and illustrates extension part 15E of connective member 15 and its surface 15A which provides an adhesive surface for connection of connective member 15 to structural member 14 of rigid core composite substrate 14-15. As earlier described, conductive assembly 30 is, this particular depicted embodiment, a pin assembly that comprises plural pins 31 held together by matrix 32.

Figure 4:
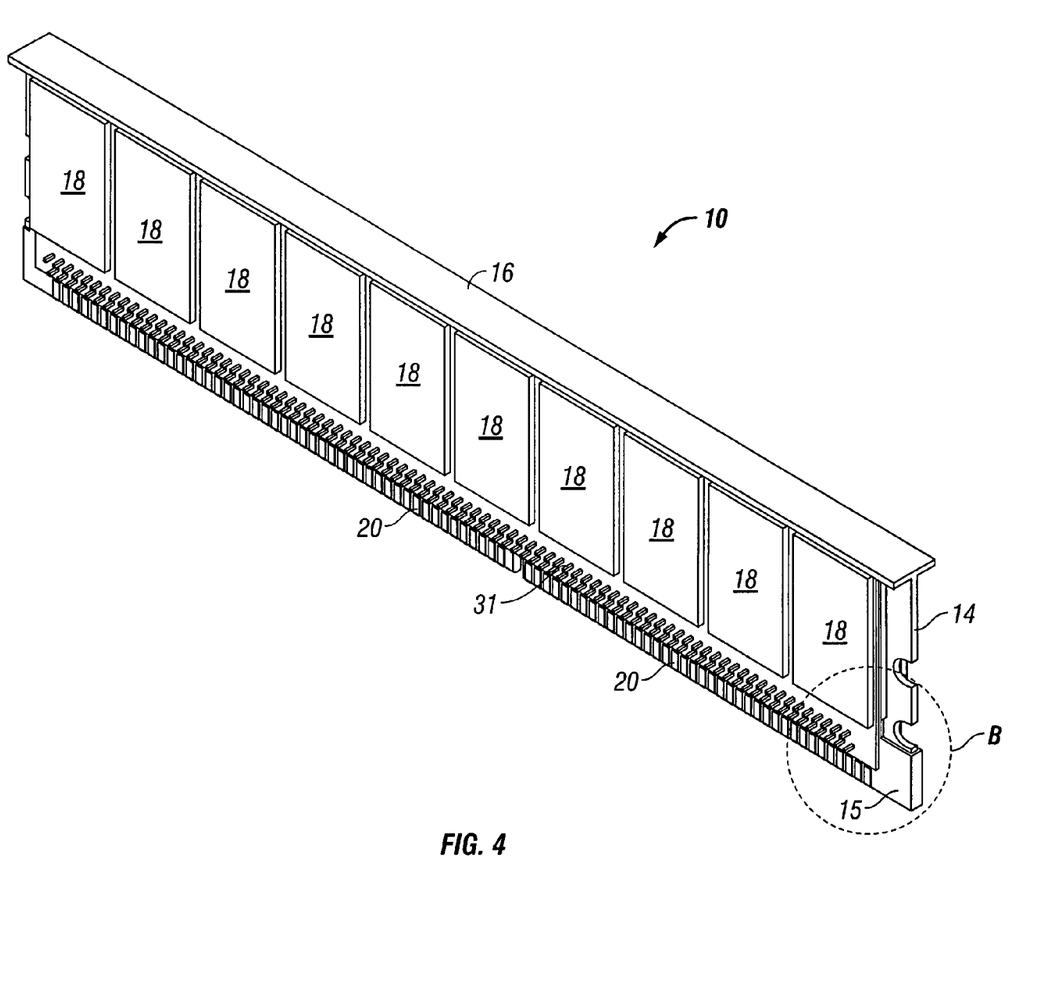
FIG. 4 is a perspective view of a circuit module in accordance with a preferred embodiment of the present invention.

FIG. 4 illustrates a perspective view of a circuit module 10 devised in accordance with a preferred embodiment of the present invention. Pins 31 are visible along the lower edge area of module 10 just above module contacts 20 which in this embodiment are edge connector contacts while the composite nature of core substrate 14-15 is illustrated.

Figure 5:
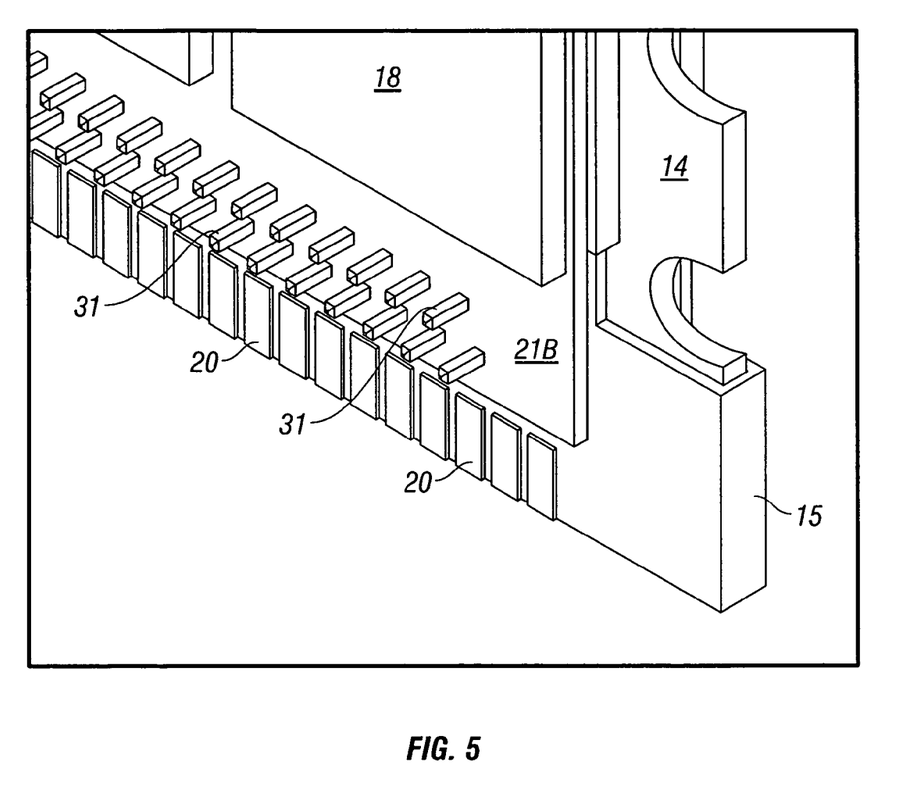
FIG. 5 is an enlarged depiction of the area of FIG. 4 designated with a "B".

FIG. 5 is an enlarged depiction of the area marked "B" in FIG. 4. Secondary substrate 21B is shown penetrated by and connected to pins 31.

Figure 6:
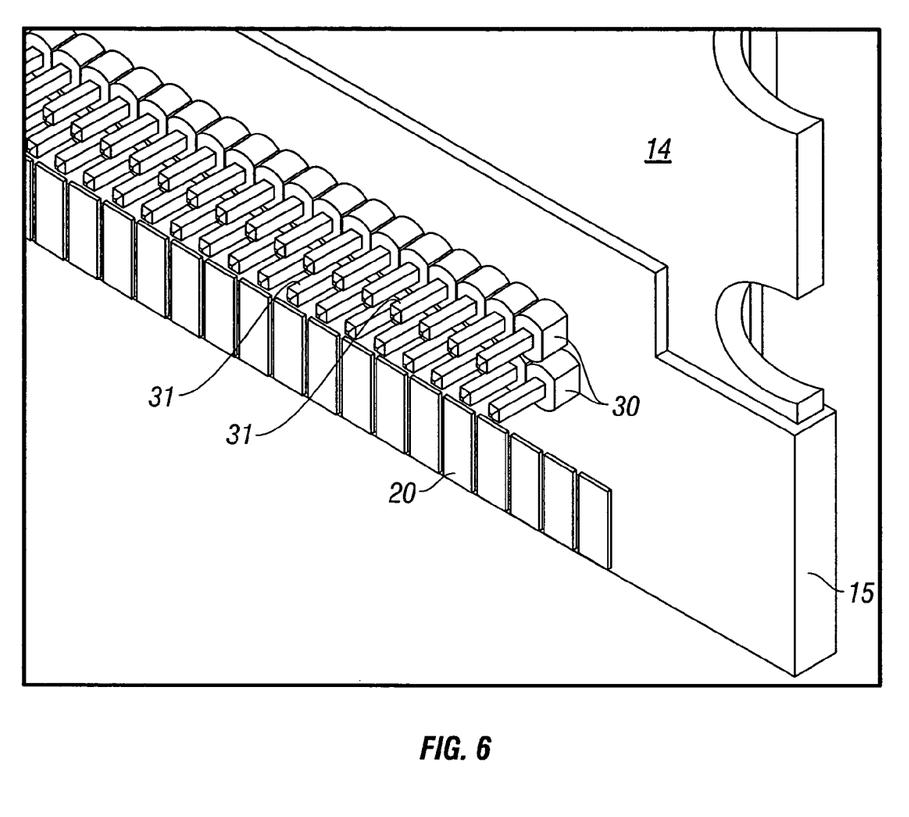
FIG. 6 is an enlarged depiction of a portion of a rigid core composite substrate before attachment of a secondary substrate.

FIG. 6 is an enlarged illustration of a portion of composite substrate 14-15 corresponding to the area designated with a "B" in FIG. 4 before attachment of secondary substrates. The two members 14 and 15 of composite substrate 14-15 are shown attached and conductive assembly 30 which, in this embodiment, is comprised of plural pins 31 is illustrated. Matrix 32 holds the plural pins together and, most of those embodiments that employ such a pin strategy, a conductive assembly will be comprised of multiple sub-assemblies each of which is comprised of plural pins 31 held together by a matrix or similar attachment 32.

Figure 7:
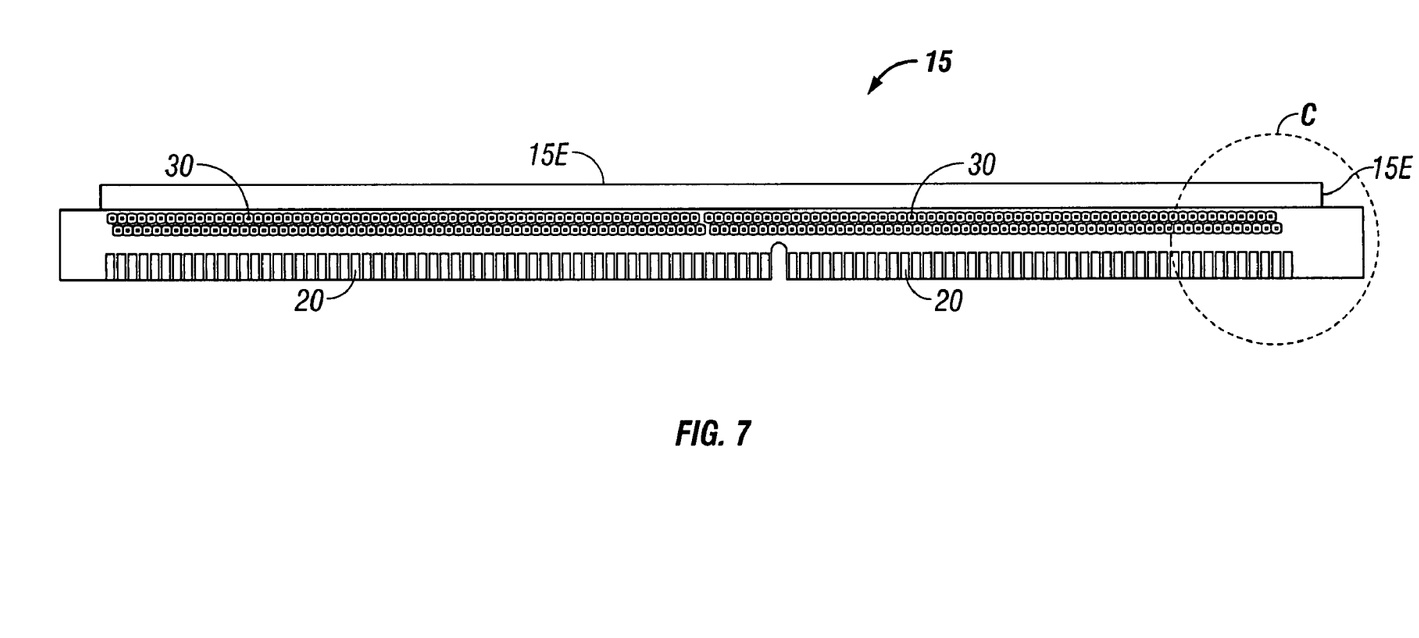
FIG. 7 is a plan view of a connective member of a core composite substrate devised in accordance with a preferred embodiment of the present invention.

FIG. 7 illustrates a connective member 15 in accordance with a preferred embodiment of the invention. Extension part 15E of connective member 15 is shown along the lateral extent of connective member 15 opposite the lateral portion adjacent to which plural module contacts 20 reside.

Figure 8:
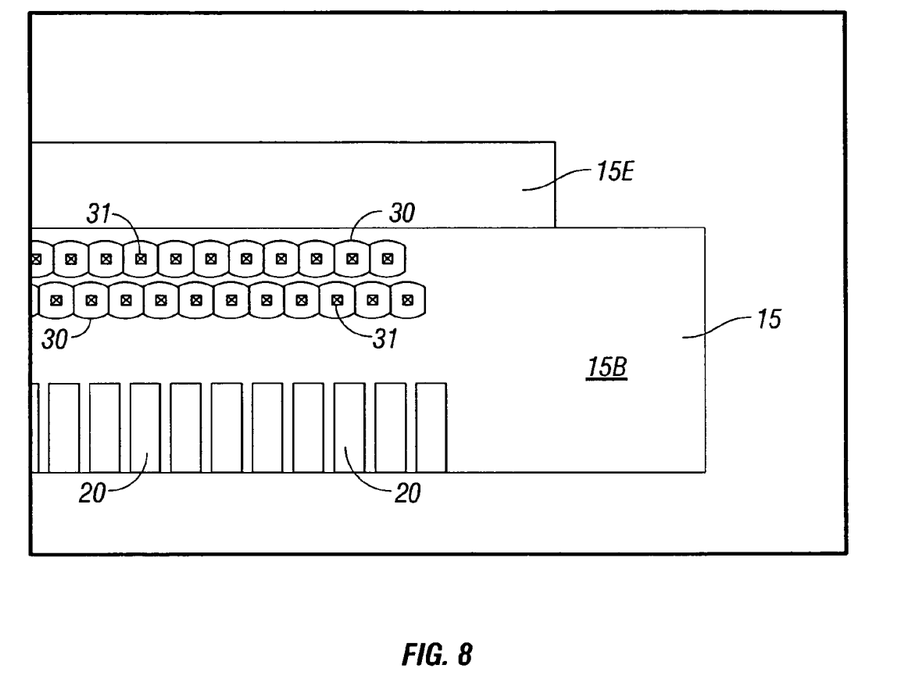
FIG. 8 is an enlarged depiction of the area of FIG. 7 designated by a "C".

FIG. 8 is an enlarged depiction of a side 15B of connective member 15 of composite substrate 14-15 illustrating the use of more than one conductive assembly 30, in this case implemented with assemblies of pins 31. Connective member 15 has two major sides with side 15B being shown in FIG. 8. Shown in larger detail is extension part 15E that, in this embodiment, is employed to implement the attachment together of connective member 15 and structural member 14 of composite substrate 14-15. Other methods to attach together structural member 14 and connective member 15 will be apparent to those of skill in the art after appreciating this disclosure.

Figure 9:
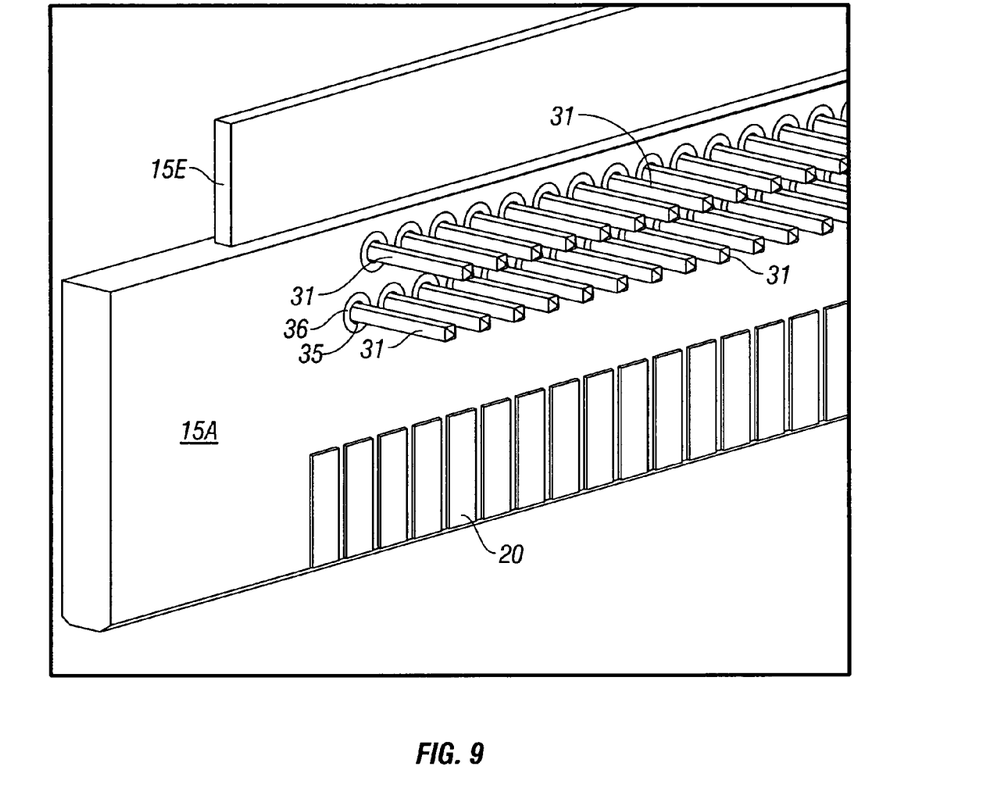
FIG. 9 is a perspective and enlarged view of a portion of a side of a connective member of a composite substrate devised in accordance with a preferred embodiment of the present invention.

FIG. 9 is an enlarged illustration of side 15A of connective member 15. Pins 31 of conductive assembly 30 are shown emergent from penetrations 35 through connective member 15 that exhibit, in the depicted embodiment, conductive surfaces 36 which, in this embodiment, are sleeves that provide connection between the conductive network of connective member 15 and conductive member 30. Those of skill will understand that being typically comprised as a multi-layer PWB, connective member 15 will typically have conductive network articulated by traces and vias of the plural layers of the member.

FIG. 10 depicts an alternative embodiment in accordance with the present invention. As earlier stated, there are a variety of techniques that may occur to those of skill in the art to combine the structural member 14 and connective member 15. This embodiment illustrates another general technique in addition to the adhesive technique earlier shown. The depicted module 10 includes a rigid composite core substrate 14-15 comprised from structure member 14 and connective member 15 which are, in this embodiment, attached to each other through a structural connector 40 which, in this instance, is depicted as a bolt and nut combination although many other structural connectors are known in the art. Certainly both adhesive and structural connector(s) may be employed on the same module. There are also two conductive assemblies 30 shown. In the depicted instance, one conductive assembly may be impressed through connective portion 15 from the 15A side while another of the conductive assemblies may be impressed through connective portion 15 from the 15B side. References 38 identify optional discrete devices typically found on circuit modules.

The invention claimed is:

1. A circuit module comprising:
   a first secondary substrate, the first secondary substrate being populated with plural ICs;
   a rigid core composite substrate comprised of a connective member and a structural member, the structural member having a first lateral side and a second lateral side, along the first lateral side there being disposed the first secondary substrate, the connective member of the rigid core composite substrate exhibiting plural module contacts;
   the structural member and the connective member being connected by adhesive; and
   the first secondary substrate and the plural module contacts being connected.

2. The circuit module of claim 1 in which the connection between the first secondary substrate and the plural module contacts is implemented with at least one conductive assembly.

3. The circuit module of claim 1 further comprising a second secondary substrate populated with plural ICs, the second secondary substrate being disposed along the second lateral side of the structural member of the rigid core composite substrate.

4. The circuit module, of claim 3 in which the first secondary substrate and the second secondary substrate are each connected to the plural module contacts.

5. The circuit module of claim 4 in which the first secondary substrate and the second secondary substrate are each connected to the plural module contacts with at least one conductive assembly.

6. The circuit module of claims 2 or 5 in which the at least one conductive assembly is comprised of plural pins.

7. The circuit module of claim 6 in which at least some of the plural pins pass through the connective member.

8. The circuit module of claims 1 or 7 in which the connective member is comprised of FR4 board.

9. The circuit module of claims 1 or 7 in which the structural member is comprised of thermally-conductive material.

10. The circuit module of claim 9 in which the structural member is comprised of metallic material.

11. The circuit module of claims 1 or 4 in which the plural ICs are CSP memory devices.

12. The circuit module of claims 2 or 3 in which the structural member of the rigid core composite substrate exhibits an extension.

13. The circuit module of claims 1, 2, or 5 in which the plural module contacts are edge connector contacts.

14. A circuit module comprising:
   a first secondary substrate and a second secondary substrate, the first secondary substrate and the second secondary substrate each being populated with plural CSP memory devices;
   a rigid core composite substrate comprised of a connective member and a structural member, the structural member having a first lateral side and a second lateral side, along the first lateral side there being disposed the first secondary substrate, and along the second lateral side there being disposed the second secondary substrate, the connective member and the structural member being connected by a structural connector, the connective member of the rigid core composite substrate exhibiting plural module contacts devised as edge connector contacts; and
   at least one conductive assembly comprised of pins that penetrate the connective member, the conductive assembly being connected to the first and second secondary substrates.

15. The circuit module of claim 14 in which the connective member and the structural member are attached to each other with adhesive and the structural connector.

16. The circuit module of claim 14 in which the structural connector comprises a nut and bolt.

17. The circuit module of claim 14 in which the edge connector contacts are on each of two sides of the connective member.

18. The circuit module of claim 14 in which the plural CSP memory devices are double data rate II (DDRII) devices.

19. A circuit module comprising:
   a first secondary substrate, the first secondary substrate being populated with plural ICs;
   a rigid core composite substrate comprised of a connective member and a structural member, the structural member having a first lateral side and a second lateral side, along the first lateral side there being disposed the first secondary substrate, the connective member of the rigid core composite substrate exhibiting plural module contacts; and
   the first secondary substrate and the plural module contacts being connected;
   wherein the structural member and the connective member of the rigid core composite substrate are attached to each other with at least one of an adhesive and a structural connector.

* * * * *

UNITED STATES PATENT AND TRADEMARK OFFICE
CERTIFICATE OF CORRECTION

PATENT NO. : 7,511,969 B2  Page 1 of 1
APPLICATION NO. : 11/345910
DATED : March 31, 2009
INVENTOR(S) : James Douglas Wehrly, Jr.

It is certified that error appears in the above-identified patent and that said Letters Patent is hereby corrected as shown below:

In Claim 4, Column 5, Line 56, delete "module," and insert -- module --, therefor.

Signed and Sealed this

Fourteenth Day of July, 2009

JOHN DOLL
*Acting Director of the United States Patent and Trademark Office*